United States Patent
Park et al.

(10) Patent No.: US 7,298,083 B2
(45) Date of Patent: Nov. 20, 2007

(54) ORGANIC ELECTROLUMINESCENCE DEVICE EMPLOYING MULTI-LAYERED PIXEL ELECTRODE AND METHOD OF FABRICATING THE SAME

(75) Inventors: Sang-Il Park, Seoul (KR); Hun-Jung Lee, Annyang-si (KR); Sang-Chul Kim, Suwon-si (KR); Chang-Soo Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 302 days.

(21) Appl. No.: 10/805,230

(22) Filed: Mar. 22, 2004

(65) Prior Publication Data

US 2004/0245923 A1 Dec. 9, 2004

(30) Foreign Application Priority Data

Jun. 3, 2003 (KR) .................... 10-2003-0035760

(51) Int. Cl.
*H01J 1/62* (2006.01)
*H01J 9/00* (2006.01)

(52) U.S. Cl. ........................ 313/505; 445/23
(58) Field of Classification Search ........ 313/498–512; 445/23–25

See application file for complete search history.

(56) References Cited

U.S. PATENT DOCUMENTS

| 6,608,449 B2* | 8/2003 | Fukunaga | 315/169.3 |
| 6,787,249 B2* | 9/2004 | Seo | 428/690 |
| 6,870,186 B2* | 3/2005 | Park et al. | 257/59 |
| 2003/0201716 A1* | 10/2003 | Yamazaki et al. | 313/506 |

FOREIGN PATENT DOCUMENTS

| KR | 2002-0027931 | 4/2002 |
| KR | 1020020055411 | 7/2002 |

* cited by examiner

*Primary Examiner*—Joseph Williams
(74) *Attorney, Agent, or Firm*—H. C. Park & Associates, PLC

(57) ABSTRACT

There is provided an organic electroluminescence device employing a multi-layered pixel electrode and a method of fabricating the same. The organic electroluminescence device comprises a substrate, a first pixel electrode located in a predetermined area on the substrate, and a second pixel electrode located on the first pixel electrode and entirely covering the first pixel electrode. Thus, the film breakdown due to the galvanic phenomenon is precluded.

21 Claims, 4 Drawing Sheets

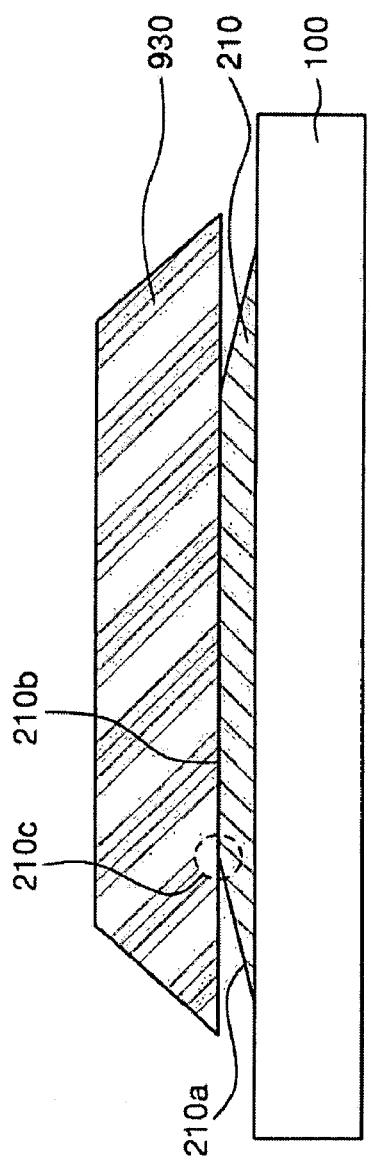
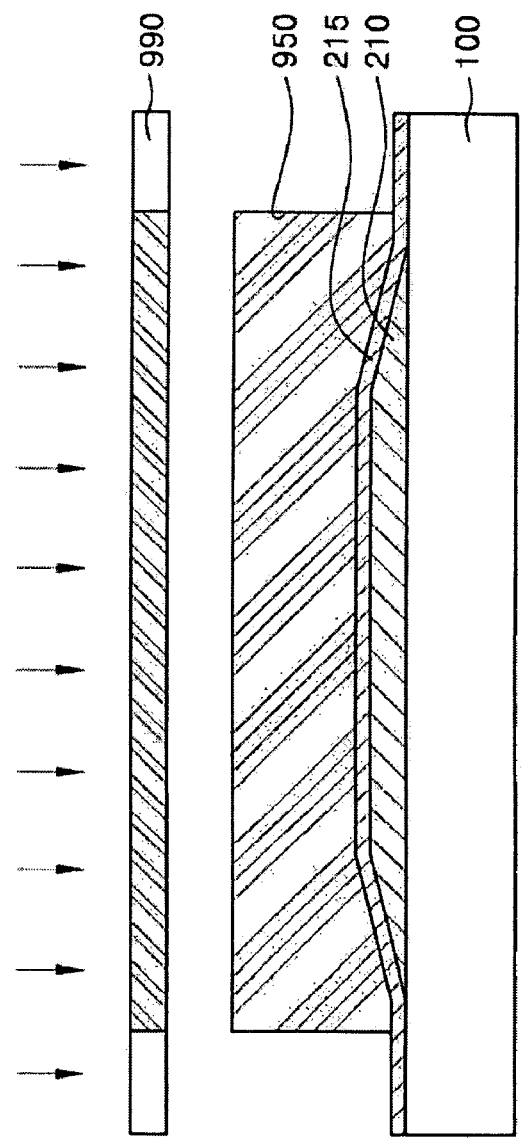

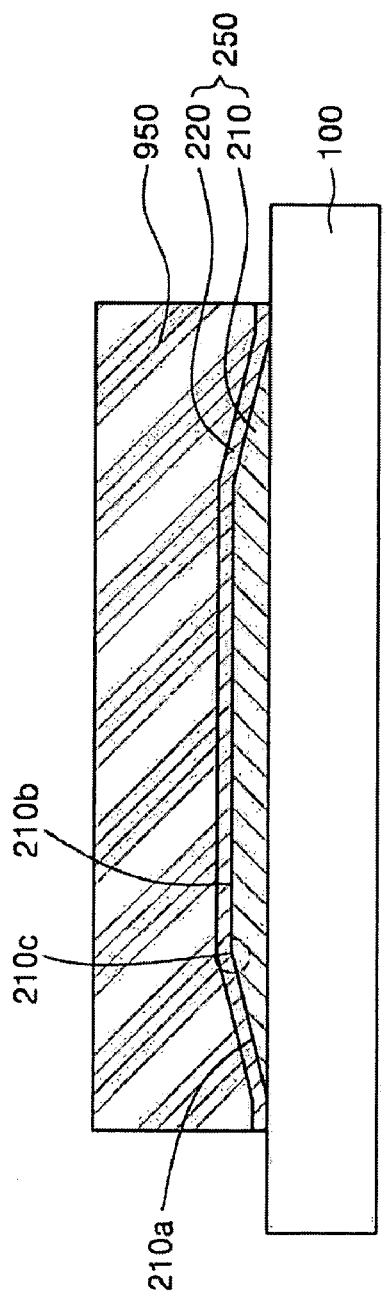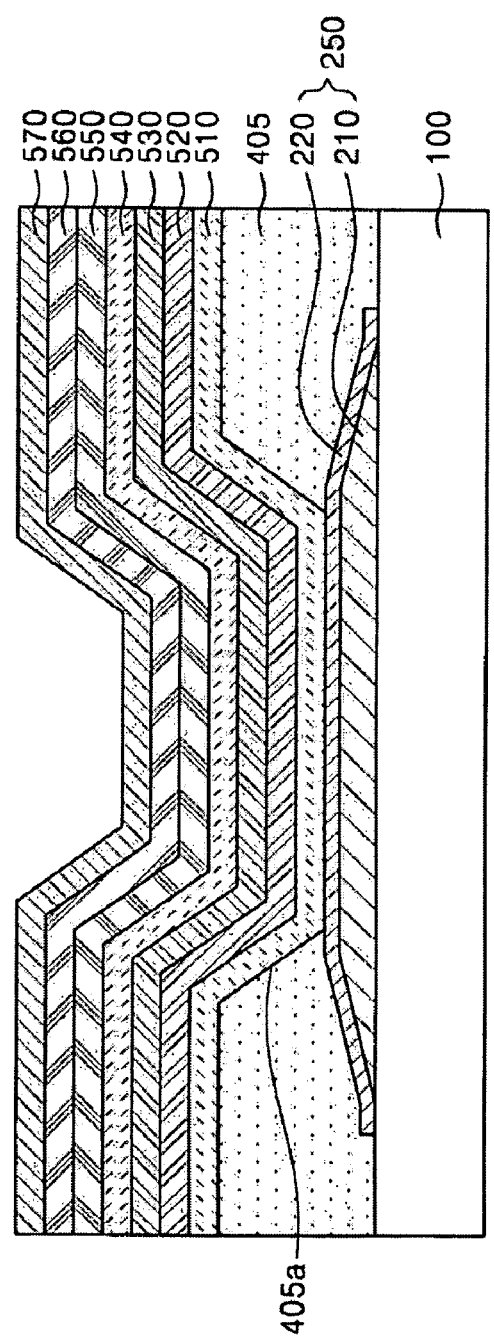

ORGANIC ELECTROLUMINESCENCE DEVICE EMPLOYING MULTI-LAYERED PIXEL ELECTRODE AND METHOD OF FABRICATING THE SAME

CROSS-REFERENCE TO RELATED APPLICATION

This application claims the benefit of Korean Patent Application No. 2003-35760, filed on Jun. 3, 2003, the disclosure of which is incorporated herein by reference in its entirety.

FIELD OF THE INVENTION

The present invention relates to an organic electroluminescence device and a method of fabricating the same and, more particularly, to an organic electroluminescence device employing a multi-layered pixel electrode and a method of fabricating the same.

BACKGROUND OF THE INVENTION

An organic electroluminescence device may be classified into a bottom-emitting type and a top-emitting type and may also be classified into an active matrix type having a pixel driving circuit in each pixel and a passive matrix type. Where the organic electroluminescence device is a bottom-emitting type, as well as an active matrix type, the pixel driving circuit and various kinds of wiring for applying voltages to the pixel driving circuit may take up space in a pixel, and an aperture ratio may be restricted. Accordingly, in order to improve the aperture ratio, the top-emitting type is introduced.

In the top-emitting type organic electroluminescence device, a conductive material having improved reflection characteristics and a suitable work function may be used for a pixel electrode. However, currently there isn't any applicable single material that satisfies such characteristics. Therefore, in order to satisfy the characteristics of the pixel electrode of the top-emitting type organic electroluminescence device, a multi-layered structure is adopted to the pixel electrode.

Korean patent application No. 2000-0058739 discloses an organic electroluminescence device of a top-emitting type. The organic electroluminescence device comprises a substrate, a reflecting plate formed on a top surface of the substrate, a first electrode formed on the top surface of the reflecting plate, an emitting layer formed on a top surface of the first electrode, and a second electrode formed on the emitting layer. Thus, by forming the reflecting plate on the top surface of the substrate, a structure in which the light emitted from the emitting layer is reflected to the opposite direction of the substrate, that is, the top-emitting type organic electroluminescence device is embodied.

FIG. 1 is a cross-sectional view of a method of fabricating an top-emitting type organic electroluminescence device employing a multi-layered pixel electrode according to the prior art.

Referring to FIG. 1, a first pixel electrode film and a second pixel electrode film are successively formed on a substrate 10. A photoresist pattern 95 is formed on the second pixel electrode film. The second pixel electrode film and the first pixel electrode film are etched in turn using the photoresist pattern 95 as a mask. Subsequently, the photoresist pattern 95 is removed. Thus, a pixel electrode 25 consisting of the second pixel electrode 22 and the first pixel electrode 21 is formed. Etching the second pixel electrode film and the first pixel electrode film in turn is generally performed by using a wet etching solution, and the photoresist pattern 95 is removed by using a stripping solution.

In the meantime, a galvanic phenomenon occurs when two materials whose electromotive forces are different are simultaneously exposed to an electrolyte solution. As a result, the material having the greater electromotive force is corroded.

In general, since the first pixel electrode 21 is a reflecting electrode and the second pixel electrode 22 is a transparent electrode, the pixel electrodes 21, 22 are formed by using different materials. Accordingly, electromotive forces of the pixel electrodes 21, 22 can be different. Consequently, the galvanic phenomenon occurs between the first pixel electrode 21 and the second pixel electrode 22 when the first pixel electrode 21 and the second pixel electrode 22 are simultaneously exposed to the etching solution or the stripping solution, that is, the electrolyte solution. As a result, an electrode having the greater electromotive force between the second pixel electrode 22 and the first pixel electrode 21 is corroded, resulting in a break down of the films of the pixel electrode 25.

SUMMARY OF THE INVENTION

Thus, the present invention is devised to solve at least the above problem. Accordingly, an aspect of the present invention is to provide an organic electroluminescence device and a fabricating method of the same to prevent a film of the pixel electrode from being broken down by precluding a galvanic phenomenon when forming the pixel electrode.

In order to achieve an aspect of the present invention, there is provided an organic electroluminescence device employing a multi-layered pixel electrode. The organic electroluminescence device comprises a substrate, a first pixel electrode located in a predetermined area on the substrate, and a second pixel electrode located on the first pixel electrode and entirely covering the first pixel electrode.

The first pixel electrode may have a side tapered toward upper part thereof. Furthermore, the first pixel electrode may comprise at least one material selected from a group consisting of aluminum (Al), aluminum alloy, silver (Ag) and silver alloy.

The second pixel electrode may comprise at least one material selected from a group consisting of indium tin oxide (ITO), indium zinc oxide (IZO), nickel (Ni), nickel oxide, platinum (Pt), platinum oxide, gold (Au), gold oxide, iridium (Ir), iridium oxide, chrome (Cr) and chrome oxide.

In addition, the first pixel electrode may comprise aluminum-neodymium (AlNd); and the second pixel electrode may comprise indium tin oxide (ITO).

The organic electroluminescence device may further comprise a third pixel electrode located between the first pixel electrode and the substrate, where the first pixel electrode entirely covers the third pixel electrode.

A side of the third pixel electrode may be tapered toward its upper part. The third pixel electrode may comprise at least one material selected from a group consisting of indium tin oxide (ITO), indium zinc oxide (IZO), nickel (Ni), nickel oxide, platinum (Pt), platinum oxide, gold (Au), gold oxide, iridium (Ir), iridium oxide, chrome (Cr) and chrome oxide.

In addition, the first pixel electrode may comprise aluminum-neodymium (AlNd), and both the second pixel electrode and the third pixel electrode may comprise indium tin oxide (ITO).

In order to achieve an aspect of the present invention, there is provided a method of fabricating the organic electroluminescence device employing a multi-layered pixel electrode. The fabricating method comprises providing a substrate, forming a first pixel electrode in a predetermined area on the substrate, and forming a second pixel electrode on the first pixel electrode to entirely cover the first pixel electrode.

The first pixel electrode may be formed to have a side tapered toward its upper part. The first pixel electrode may be formed of at least one material selected from a group consisting of aluminum, aluminum alloy, silver and silver alloy.

The second pixel electrode may be formed of at least one material selected from a group consisting of indium tin oxide (ITO), indium zinc oxide (IZO), nickel, nickel oxide, platinum, platinum oxide, gold, gold oxide, iridium, iridium oxide, chrome and chrome oxide.

In addition, the first pixel electrode may be formed of the aluminum-neodymium (AlNd), and the second pixel electrode formed of indium tin oxide (ITO).

The fabricating method may further comprise forming a third pixel electrode in the predetermined area on the substrate before the first pixel electrode is formed, and the first pixel electrode is formed to entirely cover the third pixel electrode.

The third pixel electrode may be formed to have a side tapered toward its upper part.

Further, the third pixel electrode is formed of at least one material selected from a group consisting of indium tin oxide (ITO), indium zinc oxide (IZO), nickel, nickel oxide, platinum, platinum oxide, gold, gold oxide, iridium, iridium oxide, chrome and chrome oxide. Third pixel electrode may be formed of indium tin oxide (ITO), the first pixel electrode formed of aluminum-neodymium (AlNd), and the second pixel electrode formed of indium tin oxide (ITO)

BRIEF DESCRIPTION OF THE DRAWINGS

The above and other features and advantages of the present invention will become more apparent to those of ordinary skill in the art by describing in detail preferred embodiments thereof with reference to the attached drawings.

FIGS. 2a to 2e are cross-sectional views illustrating a method of fabricating an organic electroluminescence device employing a two-layered pixel electrode according to a first embodiment of the present invention.

DETAILED DESCRIPTION OF THE INVENTION

Figure 1:
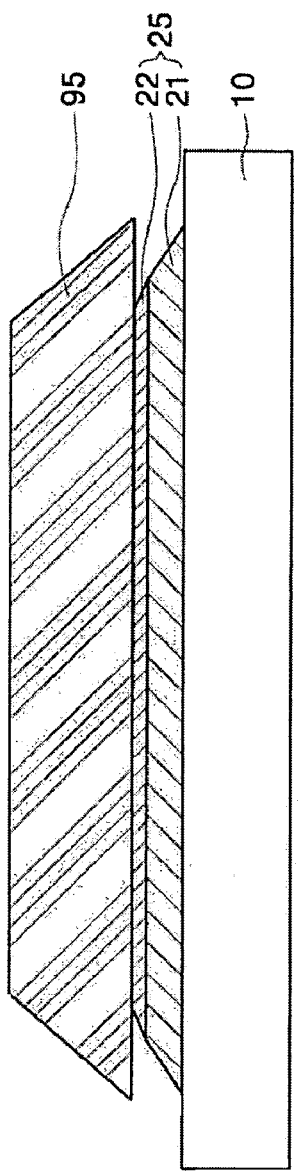
FIG. 1 is a cross-sectional view for explaining a method of fabricating an organic electroluminescence device employing a multi-layered pixel electrode according to the Prior Art.

To explain the present invention more specifically, embodiments of the present invention will be described in detail below with reference to the accompanying drawings. However, the present invention is not restricted by the embodiments described herein but can be embodied in other forms.

In the drawings, when a layer lies "on" another layer or a substrate, it is understood that the layer may be formed directly on the other layer or the substrate, or another layer may be interposed between them. Throughout the specification, the same reference numerals represent the same components.

FIGS. 2a to 2e are cross-sectional views for explaining a method of fabricating an organic electroluminescence device employing a two-layered pixel electrode according to a first embodiment of the present invention.

Figure 2A:
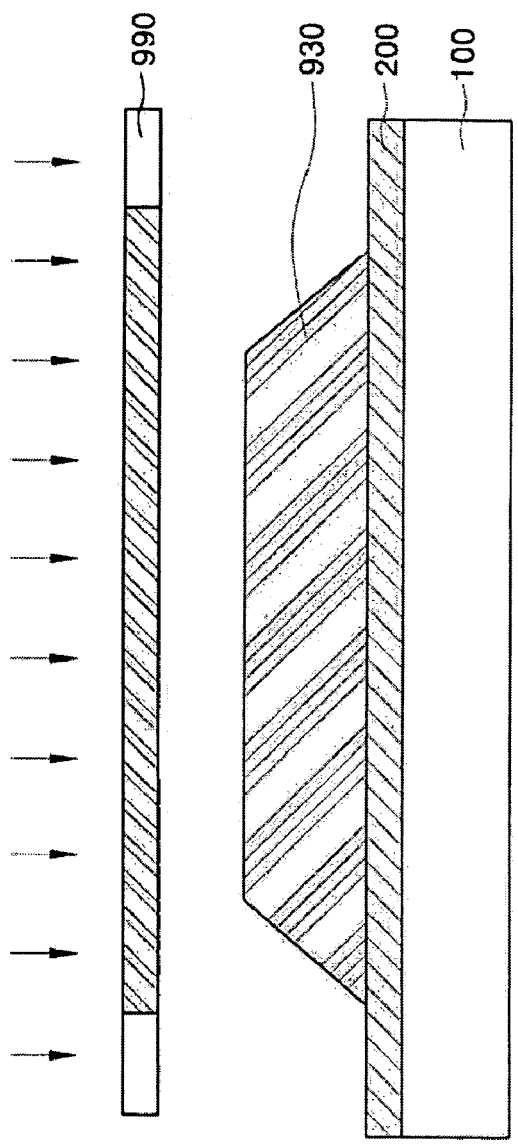

Referring to FIG. 2a, a first pixel electrode film 200 is formed on a substrate 100. In the case of an active matrix organic electroluminescence device, the substrate 100 may include a thin film transistor (not shown) formed by a conventional method. A first photoresist film may be formed on the first pixel electrode film 200, and thereafter the first photoresist film is exposed and developed by using a photomask 990 so that a first photoresist pattern 930 is formed. When the first photoresist film is exposed, the exposure may be excessively performed. Thus, not only may a pattern width of the first photoresist pattern 930 be smaller than a width of a pattern drawn in the photomask 990, but a side of the first photoresist pattern 930 may also be tapered toward its upper part.

Referring to FIG. 2b, by etching the first pixel electrode film (200 in FIG. 2a) using the first photoresist pattern 930 as a mask, a first pixel electrode 210 is formed. When the first pixel electrode film (200 in FIG. 2a) is etched, the etching may be performed excessively. Thus, a pattern width of the first pixel electrode 210 can be smaller than a pattern width of the first photoresist pattern 930. Moreover, as described above, by making a side of the first photoresist pattern 930 tapered toward its upper part, a side 210a of the first pixel electrode 210 can also be tapered toward its upper part. In other words, an angle of an edge 210c through which the side 210a and an upper face 210b of the first pixel electrode 210 meet each other may be obtuse. Further, the taper may be dull.

The first pixel electrode 210 may be formed of metal that has excellent reflectivity. According to an embodiment of the invention, the excellent reflectivity means 60% or more reflectivity. The first pixel electrode 210 may be formed of at least one material selected from a group consisting of aluminum (Al), aluminum alloy, silver (Ag) and silver alloy. Also, the first pixel electrode 210 may be formed to have thickness of 50 to 300 nanometers.

Referring to FIG. 2c, on the substrate on which the first pixel electrode 210 is formed, a second pixel electrode film 215 may be formed. A second photoresist film is formed on the second pixel electrode film 215. Successively, a second photoresist pattern 950 may be formed by exposing and developing the second photoresist film using the same photomask 990 as the photomask (990 in FIG. 2a) that exposed the first photoresist film. Unlike the first photoresist pattern (930 in FIG. 2a), the second photoresist pattern 950 may be formed to have almost the same pattern width as the width of the pattern drawn on the photomask 990.

Referring to FIG. 2d, the second pixel electrode film (215 in FIG. 2c) may be etched with a wet etching solution by using the second photoresist pattern 950 as a mask. Thus, a second pixel electrode 220 may be formed to entirely cover the first pixel electrode 210. Subsequently, a pixel electrode 250 consisting of the first pixel electrode 210 and the second pixel electrode 220 is formed by removing the second photoresist pattern 950 with a stripping solution.

As described above, in forming the first pixel electrode 210, by performing an excessive exposure and an excessive etching, a pattern width of the first pixel electrode 210 may be formed to be smaller than a pattern width drawn on the photomask (990 in FIG. 2a). A pattern width of the second pixel electrode 220 may be formed to almost the same as the pattern width drawn on the photomask (990 in FIG. 2c). Consequently, the second pixel electrode 220 may be formed to entirely cover the first pixel electrode 210. Thus, exposure of the first pixel electrode 210 and the second pixel electrode 220 simultaneously to a electrolyte solution i.e. the wet etching solution or the stripping solution, can be prevented. Accordingly, the galvanic phenomenon between the first pixel electrode 210 and the second pixel electrode 220 can be precluded. As a result, film breakdowns of the pixel electrode 250 can be lessened or prevented.

Furthermore, in forming the first pixel electrode 210, by making the side 210a tapered toward its upper part, breaking the second pixel electrode 220 on the edge 210c of the first pixel electrode 210 may be prevented. Concurrently, since the first pixel electrode 210 and the second pixel electrode 220 may be formed by using the same photomask (990 in FIGS. 2a and 2c), a processing cost can be lowered compared with a case of using different photomasks.

When the pixel electrode 250 is an anode, the second pixel electrode 220 may be formed by using a conductive material that has a work function of 4.5 to 5.8 eV so that a hole injection may be easily performed. Accordingly, the second pixel electrode 220 may be formed of at least one material selected from a group consisting of indium tin oxide (ITO), indium zinc oxide (IZO), nickel (Ni), nickel oxide, platinum (Pt), platinum oxide, gold (Au), gold oxide, iridium (Ir), iridium oxide, chrome (Cr) and chrome oxide. According to an embodiment of the invention, the second pixel electrode 220 may be formed to have thickness of 1 to 30 nanometers.

The first pixel electrode 210 may be comprised of aluminum-neodymium (AlNd), and the second pixel electrode 220 comprised of indium tin oxide (ITO).

Referring to FIG. 2e, a pixel-defined layer 405 having an opening 405a for exposing an upper surface of the second pixel electrode 220 is formed on the second pixel electrode 220. An organic film including at least an organic emitting layer 530 is formed on the exposed second pixel electrode 220 and on the pixel-defined layer 405. The organic film may further comprise at least one layer selected from a group consisting of a hole injecting layer 510, a hole transporting layer 520, a hole blocking layer 540, an electron transporting layer 550 and an electron injecting layer 560. In order to form the organic film, a conventional method such as a thermal evaporation deposition can be used.

Subsequently, a transparent electrode 570 may be formed on the organic film, such as to by using a thermal evaporation deposition, a sputtering, etc. Thereafter, the substrate 100 on which the transparent electrode 570 is formed is encapsulated. The encapsulation can be fulfilled by attaching an encapsulation plate formed of glass or transparent plastic to the substrate 100 using adhesives, and by hardening the adhesives using ultraviolet rays or heats. Other encapsulation plate materials, adhesives and adhesive hardening materials may also be used.

Figure 3:
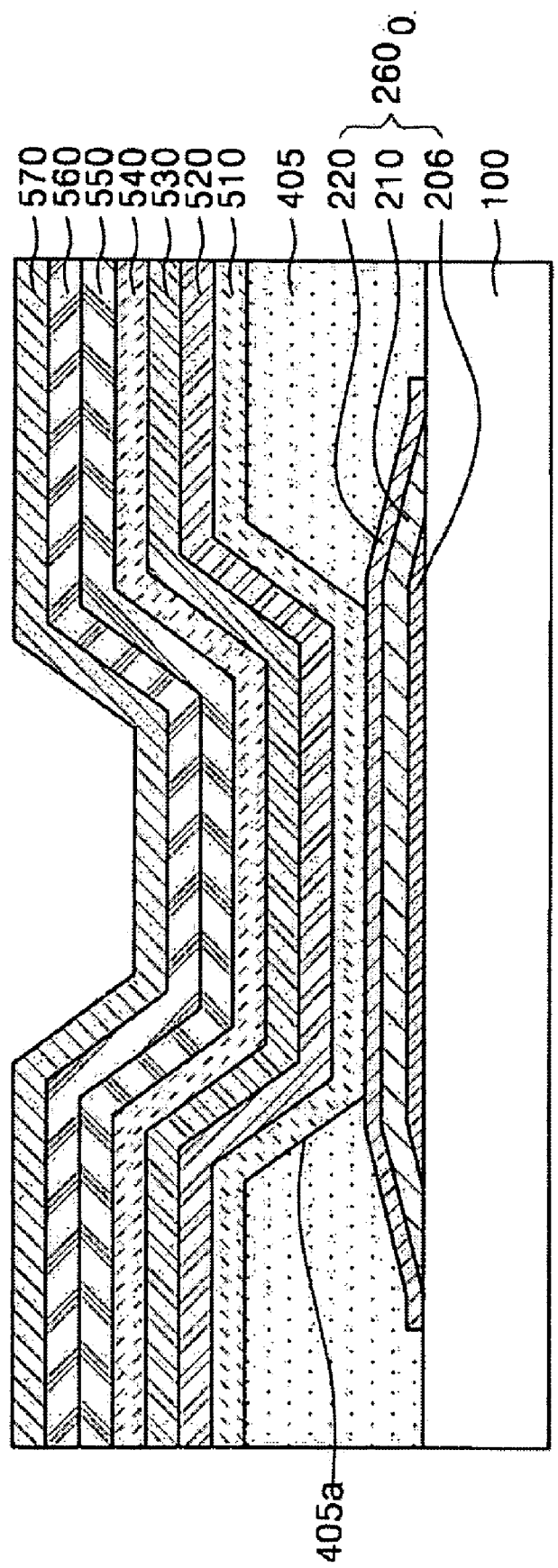
FIG. 3 is a cross-sectional view for illustrating a method of fabricating an organic electroluminescence device employing a three-layered pixel electrode according to a second embodiment of the present invention.

FIG. 3 is a cross-sectional view for explaining a method of fabricating an organic electroluminescence device employing a three-layered pixel electrode according to a second embodiment of the present invention. The method according to the present embodiment is similar to the method according to the first embodiment except that the pixel electrode has three layers.

Referring to FIG. 3, a substrate 100 is provided, and a third pixel electrode 206 is formed on the substrate 100. The third pixel electrode 206 may be formed to have a side tapered toward its upper part. The first pixel electrode 210 is formed on the third pixel electrode 206 to entirely cover the third pixel electrode 206. Thus, film breakdown due to the galvanic phenomenon between the third pixel electrode 206 and the first pixel electrode 210 can be prevented. Except those described above, the organic electroluminescence device employing the three-layered pixel electrode 260 may be fabricated in the same method as those described in the first embodiment.

The third pixel electrode 206 may be formed of at least one material selected from a group consisting of indium tin oxide (ITO), indium zinc oxide (IZO), nickel (Ni), nickel oxide, platinum (Pt), platinum oxide, gold (Au), gold oxide, iridium (Ir), iridium oxide, chrome (Cr), and chrome oxide. The third pixel electrode 206 may be formed by using ITO. Alternatively, the third pixel electrode 206 may be formed by using ITO, the first pixel electrode 210 formed by using aluminum-neodymium (AlNd), and the second pixel electrode 220 formed by using indium tin oxide (ITO).

According to the present invention as described in detail so far, in forming the multi-layered pixel electrode, the film breakdown due to the galvanic phenomenon is precluded. As a result, defects of the organic electroluminescence device can be decreased, and yield and productivity are improved so that a production cost can be lowered.

What is claimed is:

1. An organic electroluminescence device, comprising:
   a substrate;
   a first pixel electrode located in a predetermined area on the substrate; and
   a second pixel electrode located on the first pixel electrode and contacting at least an upper surface and a side surface of the first pixel electrode,
   wherein the side surface of the first pixel electrode has a taper.

2. The organic electroluminescence device according to claim 1, wherein the side surface is tapered towards an upper part of the first pixel electrode.

3. The organic electroluminescence device according to claim 1, wherein the first pixel electrode is comprised of at least one material selected from a group consisting of aluminum, aluminum alloy, silver and silver alloy.

4. The organic electroluminescence device according to claim 1, wherein the second pixel electrode is comprised of at least one material selected from a group consisting of indium tin oxide (ITO), indium zinc oxide (IZO), nickel, nickel oxide, platinum, platinum oxide, gold, gold oxide, iridium, iridium oxide, chrome and chrome oxide.

5. The organic electroluminescence device according to claim 1, wherein the first pixel electrode is comprised of the aluminum-neodymium (AlNd), and the second pixel electrode is comprised of indium tin oxide (ITO).

6. The organic electroluminescence device according to claim 1, further comprising a third pixel electrode located between the first pixel electrode and the substrate; and where the first pixel electrode contacts at least an upper surface and a side surface of the third pixel electrode.

7. The organic electroluminescence device according to claim 6, wherein the third pixel electrode has a side tapered toward an upper part thereof.

8. The organic electroluminescence device according to claim 6, wherein the third pixel electrode is comprised of at least one material selected from a group consisting of indium tin oxide (ITO), indium zinc oxide (IZO), nickel, nickel oxide, platinum, platinum oxide, gold, gold oxide, iridium, iridium oxide, chrome and chrome oxide.

9. The organic electroluminescence device according to claim 6, wherein the first pixel electrode is comprised of aluminum-neodymium (AlNd); and both the second pixel electrode and the third pixel electrode are comprised of indium tin oxide (ITO).

10. A method of fabricating an organic electroluminescence device, comprising the steps of:
providing a substrate;
forming a first pixel electrode in a predetermined area on the substrate; and
forming a second pixel electrode on the first pixel electrode to contact at least an upper surface and a side surface of the first pixel electrode,
wherein the side surface of the first pixel electrode is formed to have a taper.

11. The method of fabricating an organic electroluminescence device according to claim 10, wherein the side surface is tapered towards an upper part of the first pixel electrode.

12. The method of fabricating the organic electroluminescence device according to claim 10, wherein the first pixel electrode and the second pixel electrode are formed by using a same photomask.

13. The method of fabricating the organic electroluminescence device according to claim 10, wherein the first pixel electrode is formed of at least one material selected from a group consisting of aluminum, aluminum alloy, silver and silver alloy.

14. The method of fabricating the organic electroluminescence device according to claim 10, wherein the second pixel electrode is formed of at least one material selected from a group consisting of indium tin oxide (ITO), indium zinc oxide (IZO), nickel, nickel oxide, platinum, platinum oxide, gold, gold oxide, iridium, iridium oxide, chrome and chrome oxide.

15. The method of fabricating the organic electroluminescence device according to claim 10, wherein the first pixel electrode is formed of the aluminum-neodymium (AlNd); and the second pixel electrode is formed of indium tin oxide (ITO).

16. The method of fabricating the organic electroluminescence device according to claim 10, further comprising the step of forming a third pixel electrode in the predetermined area on the substrate before the first pixel electrode is formed; and the first pixel electrode is formed so as to contact at least an upper surface and a side surface of the third pixel electrode.

17. The method of fabricating the organic electroluminescence device according to claim 16, wherein the third pixel electrode is formed to have a side tapered toward an upper part thereof.

18. The method of fabricating the organic electroluminescence device according to claim 16, wherein the third pixel electrode is formed of at least one material selected from a group consisting of indium tin oxide (ITO), indium zinc oxide (IZO), nickel, nickel oxide, platinum, platinum oxide, gold, gold oxide, iridium, iridium oxide, chrome and chrome oxide.

19. The method of fabricating the organic electroluminescence device according to claim 16, wherein third pixel electrode is formed of indium tin oxide (ITO); the first pixel electrode is formed of aluminum-neodymium (AlNd); and the second pixel electrode is formed of indium tin oxide (ITO).

20. An organic electroluminescence device, comprising:
a substrate;
a first pixel electrode located in a predetermined area on the substrate, where the first pixel electrode has a side surface tapered toward an upper part thereof;
a second pixel electrode located on the first pixel electrode and contacting at least an upper surface and the side surface of the first pixel electrode; and
a third pixel electrode located between the first pixel electrode and the substrate, where the first pixel electrode contacts at least an upper surface and a side surface of the third pixel electrode, and where the third pixel electrode has the side surface tapered toward an upper part thereof.

21. A method of fabricating an organic electroluminescence device, comprising the steps of:
providing a substrate;
forming a first pixel electrode in a predetermined area on the substrate, where the first pixel electrode is formed to have a side surface tapered toward an upper part thereof;
forming a second pixel electrode on the first pixel electrode to contact at least an upper surface and the side surface of the first pixel electrode; and
forming a third pixel electrode in a predetermined area on the substrate before the first pixel electrode is formed, where the first pixel electrode is formed so as to contact at least an upper surface and a side surface of the third pixel electrode and the third pixel electrode is formed to have the side surface tapered toward an upper part thereof.

* * * * *